United States Patent
Denis (10) Patent No.: US 6,186,316 B1
(45) Date of Patent: Feb. 13, 2001

(54) METHOD AND DEVICE FOR THE PRECISE ELECTROLYTIC DEPOSITION AND ETCHING OF METAL LAYERS ON CIRCUIT BOARDS AND CONDUCTORS FOILS IN CONTINUOUS SYSTEMS

(75) Inventor: Jacques Denis, Paris-La Defense (FR)

(73) Assignee: Atotech Deutschland GmbH (DE)

( * ) Notice: Under 35 U.S.C. 154(b), the term of this patent shall be extended for 0 days.

(21) Appl. No.: 09/331,099

(22) PCT Filed: Dec. 10, 1997

(86) PCT No.: PCT/DE97/02945

§ 371 Date: Jun. 16, 1999

§ 102(e) Date: Jun. 16, 1999

(87) PCT Pub. No.: WO98/28468

PCT Pub. Date: Jul. 2, 1998

(30) Foreign Application Priority Data

Dec. 20, 1996 (DE) .............................. 196 53 272

(51) Int. Cl.⁷ .............................. B65B 15/00; B65B 17/00
(52) U.S. Cl. .................. 198/804; 198/803.7; 198/803.9; 198/575; 198/605
(58) Field of Search .............................. 198/468.2, 468.5, 198/468.9, 470.1, 472.1, 478.1, 575, 605, 606, 612, 678.1, 804, 803.7, 803.9; 271/247, 252; 118/504

(56) References Cited

U.S. PATENT DOCUMENTS 4,589,541 * 5/1986 Lisec ................................. 198/575 X
5,915,525 * 6/1999 Baker et al. ..................... 198/575 X

FOREIGN PATENT DOCUMENTS

| 42 05 660 | 2/1992 | (DE) . |
| 195 04 517 | 2/1995 | (DE) . |
| 0 254 030 | 6/1987 | (EP) . |

* cited by examiner

Primary Examiner—Christopher P. Ellis
Assistant Examiner—Gene O. Crawford
(74) Attorney, Agent, or Firm—Paul & Paul (57) ABSTRACT

The invention concerns a process for precise electrolytic precipitation and etching of metals up to the marginal area of printed-circuit board and printed-circuit film panel in a continuous-cycle plant. In continuous-cycle plants, the panels are grasped by clips at least at one edge. The clips are used for current supply to the panels and, if necessary, for transporting the latter. Among other factors, owing to the shielding effect of the clips there are great plate thickness differences in the marginal area of the panels. This marginal area cannot be used for precise printed-circuit boards. The invention improves the plate thickness distribution in this marginal area by separating the plant into several partial plants and a defined offset V of the clip gripping points from plant part to plant part. The offset is preferably adjusted to values corresponding to the quotient of the clip distance T and the number of subsequently arranged plant parts. The distance is kept constant by electrical or by mechanical measures.

14 Claims, 6 Drawing Sheets

METHOD AND DEVICE FOR THE PRECISE ELECTROLYTIC DEPOSITION AND ETCHING OF METAL LAYERS ON CIRCUIT BOARDS AND CONDUCTORS FOILS IN CONTINUOUS SYSTEMS

DESCRIPTION

The invention concerns a process for precise electrolytic precipitating or removal of metals by slight etching and/or removal by etching up to the marginal area of printed-circuit boards and films in continuous-cycle plants.

Continuous-cycle plants permit the production of printed-circuit board and film panels with relatively low effort. Printed-circuit board panel is similar to the printed-circuit board raw blank. The same applies to printed-circuit film raw blank. This raw blank has a maximum width across the transport direction determined by the plant width. For carrying current to the printed-circuit board blank for electrolytic appliance of metal, these are usually contacted via contact clips connected to the negative pole of a direct-current source which take the printed-circuit boards at their edge in an electrically conductive manner. The anti-pole is built by soluble and insoluble anodes. After electroplating and after the post-treatment the printed-circuit boards are cut out of the printed-circuit board panel. Depending on the actual printed-circuit board size, one or several smaller printed-circuit boards are produced from one panel. For economic reasons, producers try to use the printed-circuit board panel as optimal as possible, i.e. close to the edge.

Among other factors, the quality of a printed-circuit board is determined by the plate thickness distribution on the surface and in the drill holes. Owing to engineering reasons, the plate thickness at the surface and in the drill holes in the marginal area of a panel strongly deviates from the plate thickness of the remaining surface areas. The thickness deviations may reveal positive as well as negative values. Among other items, the number of contact clips, their shape and insulation, the quality and the condition of the contact surfaces of contact clips, the geometry of the anodes and the shield elements as well as the distance of a panel to the subsequent one in transport direction of the continuous-cycle plant are influencing factors.

Particularly strong variations of plate thickness distribution exist in the area of electrical contact to the panel. For design reasons, the installation of shields is not possible to a sufficient extent here. The contact elements require the space which is necessary for metal deposition.

Publication DE 42 05 660 C1 describes a process for improving the plate thickness distribution in the marginal area of work pieces attached to cathode rails, e.g. printed-circuit boards, that are electroplated. Owing to the voltage drop in the cathode rail and/or in the work piece racks there are differences of electrical voltage between adjacent work pieces. These differences in voltage result in plate thickness differences in the marginal area of adjacent work pieces. These plate thickness differences are avoided by the temporary supply of current into the cathode rail and/or into the racks from opposite sides. This compensates the voltage loss in the rails and racks.

However, the optimisation of plate thicknesses on the work pieces has no effect on plate thickness variations in the direct area of clip grip positions.

EP-A-0 254 030 describes a horizontal continuous-cycle plant for electrolytic application of metal onto objects with board shape such as printed-circuit boards. Rotating contact elements in the form of clips grasp the boards. The clips are used for transporting the boards and—simultaneously—for supplying the galvanising current. The clips and also the boards have cathodic potential. In order to avoid a metallisation of clips, the electrically conductive clip is normally provided with an insulation layer apart from a small contact surface. For electrical and mechanical reasons, the clips have certain minimum dimensions. Several clips grasp one printed-circuit board panel.

A disadvantage of this appliance is the fact that the electrical field in the clip area is shielded in an unfavourable manner. This results in large plate thickness differences in the respective clip area. Moreover, the condition of contact surfaces, the electrical contact resistance and/or resistance of contact surfaces and the complete current conduction from direct current source to electric lines and screw connections determine the plate thickness. Under a clip nearly no metal is precipitated. In contrast to this, between two clips an excessive amount of copper is precipitated. These differences could not even be avoided by a marginal shield. The great plate thickness differences decrease towards the panel centre. The marginal area of the printed-circuit board panel—particularly from the clip area—cannot be used for the printed-circuit boards to be cut out. Owing to the strong variations in plate thickness, the quality of the adjacent areas is worse than the average. The width of the usable marginal area depends on the given admissible tolerance of the galvanising plate thickness. Especially with the fine conductor technology—that is used more and more frequently—this tolerance is low. In practice, owing to the clip influences, the unusable marginal strip width is between 25 and 50 millimeters. Despite cutting off this marginal area, the unfavourable coming together of several factors may cause the plate thickness differences on the remaining board to be as great that waste is produced. Additionally, there are considerable costs for cutting off the marginal areas. If there is, for example, a transport velocity of 1 meter per minute and an unusable strip width of 25 millimeters, the resulting daily loss in case of a two-shift operation is about 25 square meters.

DE 195 04 517 C1 describes a process and an appliance for galvanising board-shaped material to be handled in horizontal continuous-cycle plants. The material to be handled, preferably printed-circuit boards, is grasped by clips. The clips are used for supplying current and for transporting the printed-circuit boards.

With the help of sensors that scan the arriving material to be handled and under observance of the transport velocity a foresighted determination takes place as to whether material to be handled will be available at the gripping point of a clip or whether there will be a gap between two subsequent individual boards. In case of a determined gap, the clip will be controlled such that it does not close. This avoids a galvanising of the clip contacts which would lead to malfunctions.

A disadvantage, however, is the fact that the printed-circuit boards are grasped by clips without synchronisation at random positions in the marginal area of the boards. For this reason, the problem of the uneven plate thickness distribution in the clip range cannot be solved.

Therefore, the problem forming the basis of the invention is to avoid the disadvantages of the existing processes and appliances and, in particular, to considerably reduce the plate thickness differences on the printed-circuit board panel occurring during galvanising and especially in the area of the clips, and—thus—to increase the usable area of the panel (meeting the high quality requirements regarding plate thickness distribution) and to remarkably reduce the waste level (caused by plate thickness differences in the marginal area). There are also corresponding problems with the removal or thinning of metal layers during electrolytic etching.

The problem is solved by a process according to patent claim 1 and by an appliance according to patent claim 9.

The process according to the invention for a precise electrolytic precipitation of metal layers up to the marginal area of printed-circuit board and printed-circuit film panels in a continuous-cycle plant includes the following process steps:

a) The panels are grasped in one or two opposite marginal areas by several contact elements driven in transporting direction.

b) The panels are grasped by the contact elements at different contact gripping points in several plant parts being arranged subsequently in transporting direction. This minimises variations of the metal plate thickness in the marginal area of the panels.

The appliance according to the invention used for performing the process includes a) transport means and b) driven contact elements for the panels.

c) The contact elements are arranged such that they can grasp the panels in one or two opposite marginal areas.

d) The continuous-cycle plant consists of several plant parts subsequently arranged in transporting direction.

e) The contact elements are arranged such that the panels can be grasped at different contact gripping points in several plant parts.

Preferably the contact elements are arranged such that they have equally large distances T from each other. Thus, the contact elements always grasp the panels at the same position within one plant part.

Moreover, it is advantageous to drive the contact elements such that the contact gripping points on the panel are offset from plant part to plant part by a presettable constant distance V. This offset V is preferably set to a value resulting from the quotient of distance T of the contact elements and the number of subsequently arranged plant parts.

By means of electrical synchronisation of the drives of the contact elements in the plant parts the offset can be kept constant. For this purpose, an appropriately designed control is used for the drives of the contact elements in the plant parts such that the contact gripping points on the panel can be offset by a presettable constant distance V from plant part to plant part.

The phase relation of the rotating contact elements, for example of clips, of each plant part can further be adjusted by electrical or mechanical synchronisation. In this way, the distance V of the contact gripping points can be kept constant from plant part to plant part. The drives of the contact elements in the plant parts are designed accordingly.

Synchronisation of the drives is not limited to an electrical synchronisation. With a common mechanical drive in all series connected plant parts the phase synchronisation can be realised in the same manner. When commissioning the plants, the rotating clips in each plant part are mechanically adjusted towards each other in its phase relation. For this purpose, corresponding mechanical adjusting points, for example in the form of locking screws, can be provided.

The invention is subsequently described in more detail with the help of FIGS. 1 to 6. They show.

Figure 1:
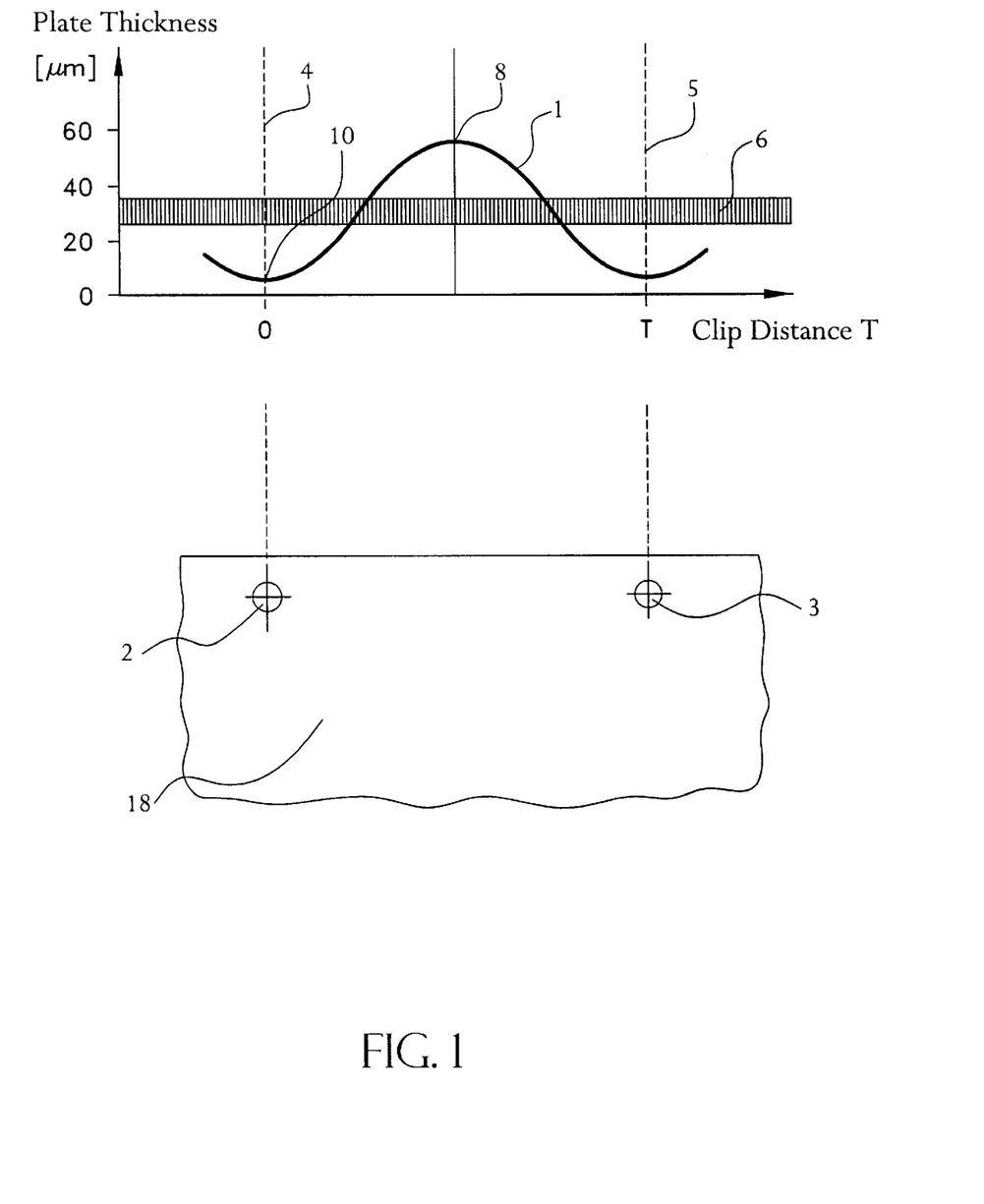
FIG. 1: Example for the plate thickness flow in the clip area, achieved with a process according to the state of the art, as well as a schematic top view of the appropriate cut-out of the printed-circuit board panel.
Figure 4:
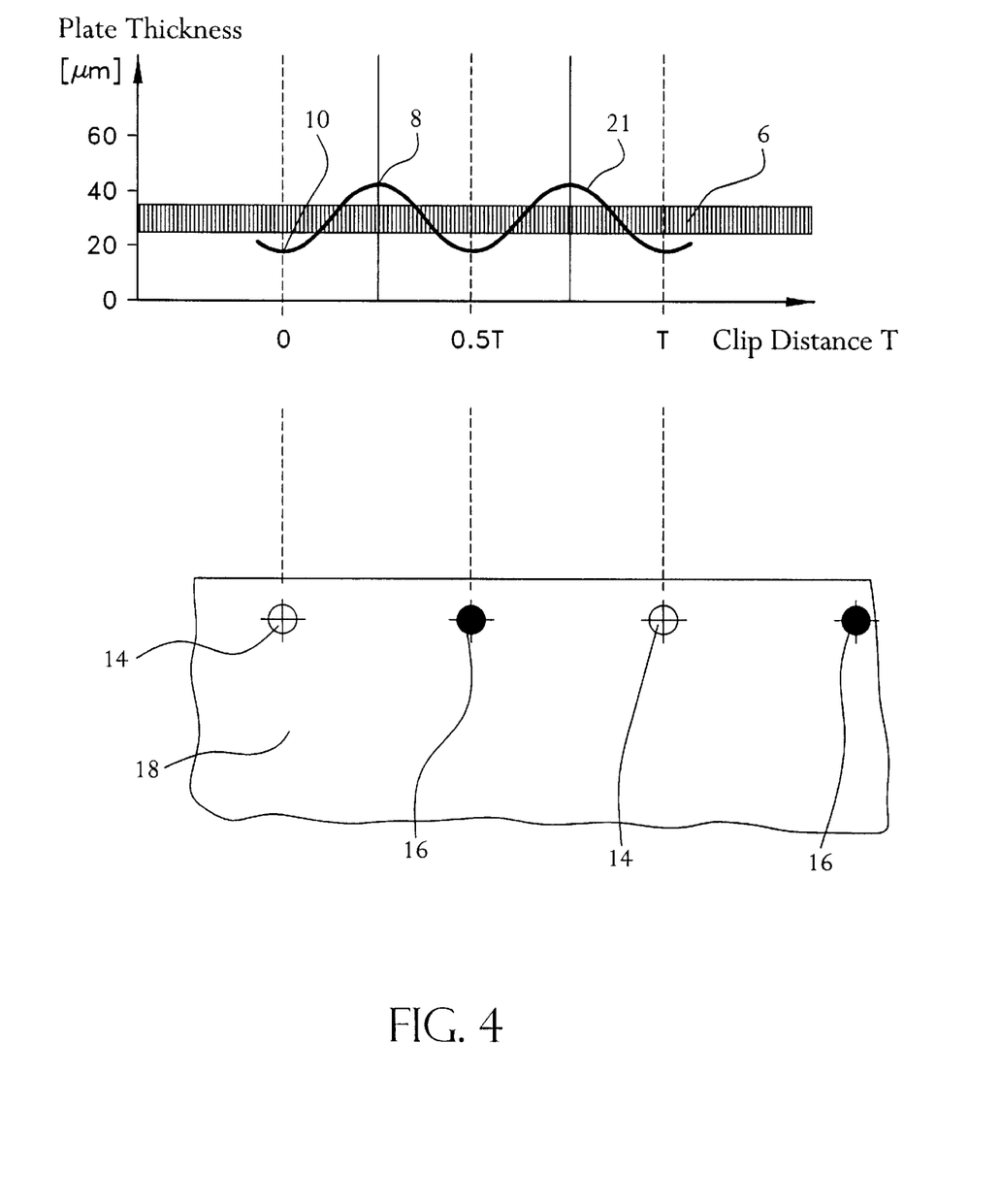
FIG. 4: Example for the plate thickness flow in the clip area with simply offset contact gripping points according to the invention and the appropriate panel cut-out in top view.
Figure 5:
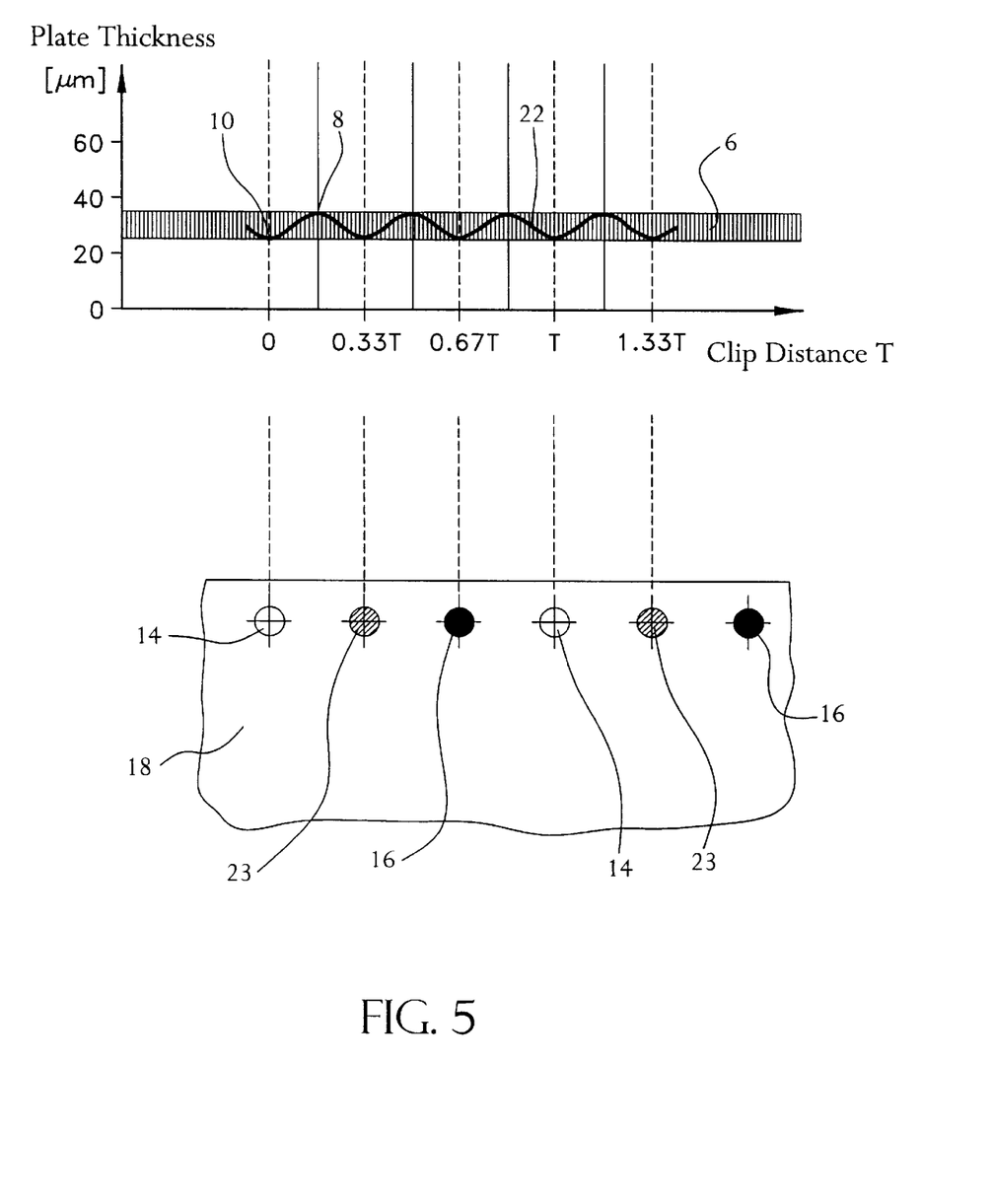
FIG. 5: Example for the plate thickness flow in the clip area with double offset contact gripping points according to the invention and a schematic top view of the corresponding panel cut-out.

FIGS. 1, 4 and 5 show the plate thickness flow on a printed-circuit board or printed-circuit film panel 18 in the clip area in transporting direction 13. As an example, absolute plate thickness in $\mu$m and a given tolerance field are entered. The distance of the contact gripping points in a continuous-cycle plant, i.e. the grip distance in transporting direction, is also called spacing T.

FIG. 1 shows the plate thickness flow 1—achieved with a process and an appliance according to the state of the art.

Adjacent contact gripping points grasp the printed-circuit board panel 18 at positions 2 and 3. In the diagram of FIG. 1 the position of the contact gripping points is represented by the dashed lines 4 and 5. Near the contact gripping points the plate thickness decreases to a minimum owing to the shielding of the clips and increases to a maximum between the contact gripping points. The tolerance field 6 is fallen below and/or exceeded by far.

Figure 2:
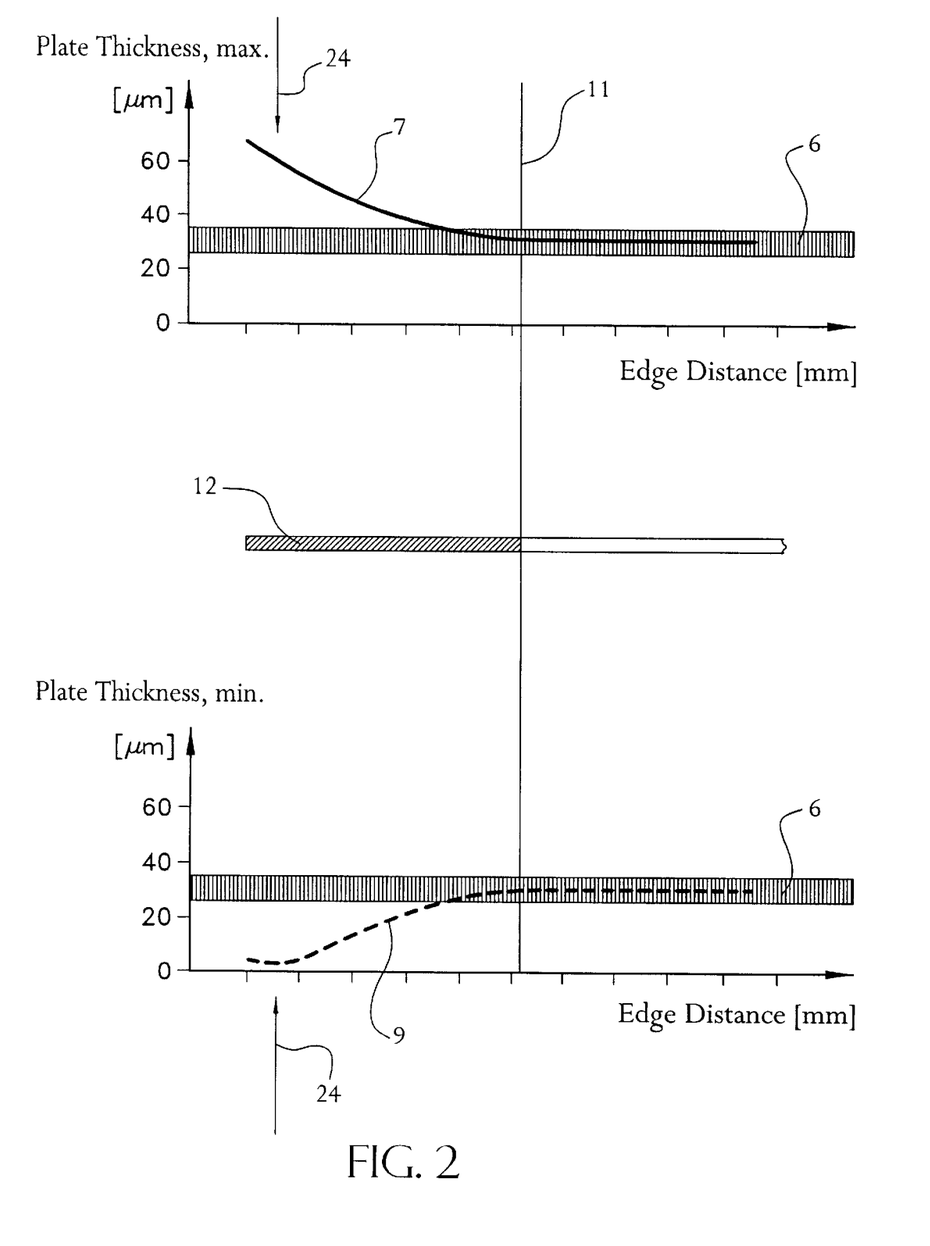
FIG. 2: Examples for the plate thickness flow at the panel edge across the transporting direction, achieved with a process according to the state of the art.

FIG. 2 shows a corresponding plate thickness flow 7 for the maximum 8 and a corresponding flow 9 for the minimum 10. The marginal strip 12 of the printed-circuit board (represented in hatches) is unusable until limit 11 owing to falling below and/or exceeding the tolerance area and, thus, has to be rejected.

Figure 3:
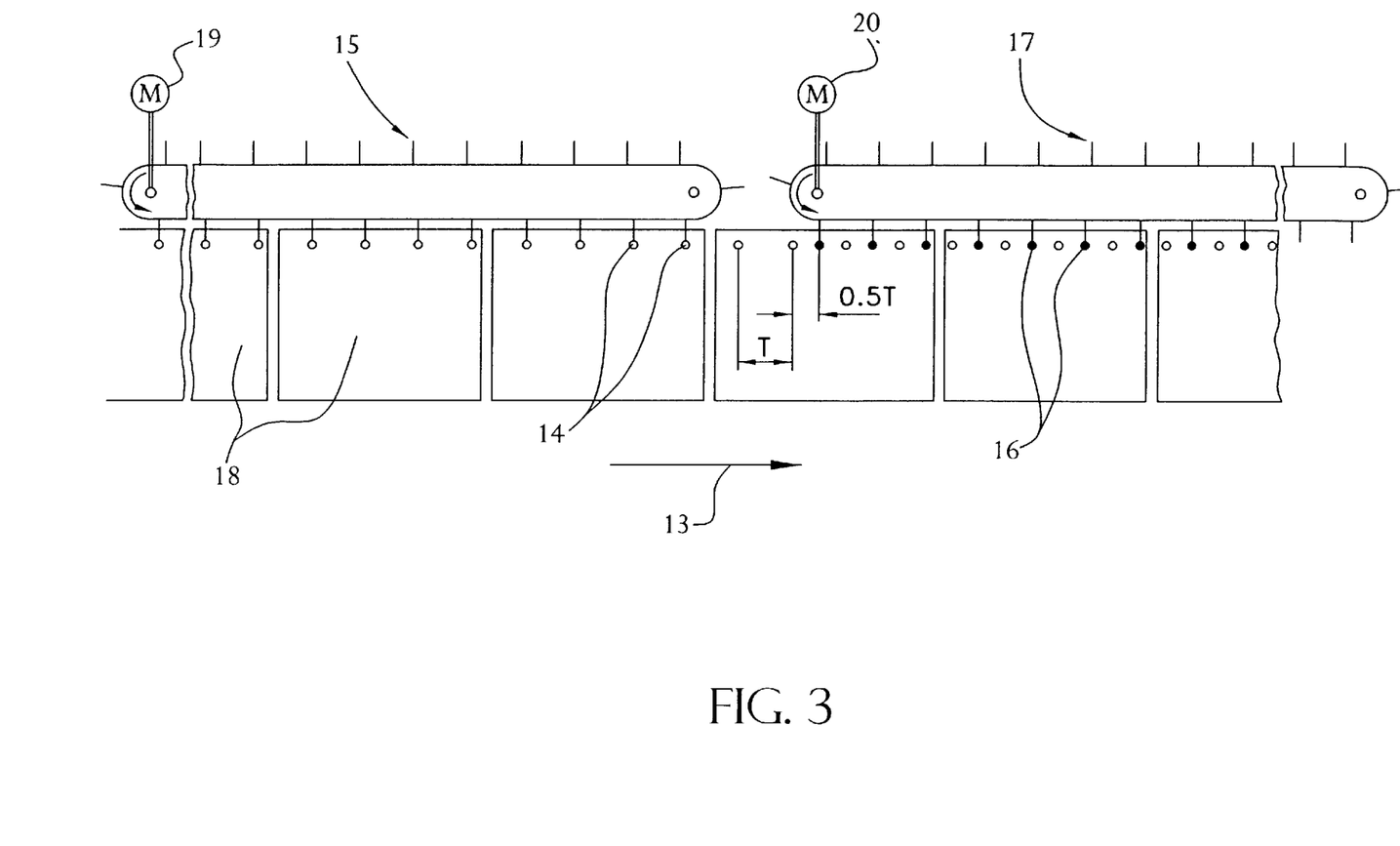
FIG. 3: Schematic view of the appliance according to the invention.

FIG. 3 schematically shows the appliance according to the invention: Not represented are separate transporting means unless the contact elements are simultaneously used for transporting the panel 18. The plant consists of two plant parts 15 and 17. The rotating clips and the continuously cycled printed-circuit board panels 18 are shown. In case of a horizontal continuous-cycle plant this is the top view. If the panels are vertically held, this is a side view. As a matter of fact, also other configurations with inclined panels are possible. Arrow 13 shows the transporting unit. The contact gripping points 14 of the first plant part 15 are represented as a circle. The contact gripping points 16 of the second plant part 17 are represented as a filled circle. The offset V of points 14 and 16 according to the invention on the printed-circuit board panel in this example defines half a spacing T. In general, the offset V=T, divided by the number of subsequently connected plant parts. The defined offset of the contact gripping points is achieved by the following measures: All plant parts lead to uniform distance of the contact gripping points through equal distance of the contact elements in transporting direction. All plant parts produce at the same transporting and feeding velocity for the contact elements. The distance from one plant part to the following plant part remains constant. Under these conditions, the individual drives 19 and 20 in both plant parts run with phase synchronisation. The distance of the contact gripping points 0,5 T corresponds to a phase shift of 180° which is permanently kept between both drives. It is safeguarded by synchronising the drives 19 and 20 with known means and methods of drive engineering. With the same means and methods, the phase relations are electrically adjusted.

FIG. 4 shows how the plate thickness flow 21 is levelled by the defined offset V of the contact gripping points 14 and 16. The plate thickness minimum 10 is increased, the maximum 8 is reduced. The tolerance zone 6 represented as an example, however, is still exceeded and/or fallen below.

FIG. 5 shows the plate thickness flow 22 in three series connected continuos-cycle plant parts. The contact gripping points of the first and second plant part are again designated with 14 and 16 and those of the third one with 23. In this example, the tolerance zone is not exceeded or fallen below since owing to the more frequent change of contact elements during the transfer from one plant part to the next and owing to the exposure of the former covered contact gripping points smaller variations occur. For this reason, the points of the board and/or film surface that have previously been used as contact gripping points can be metallised in subsequent plant parts.

Figure 6:
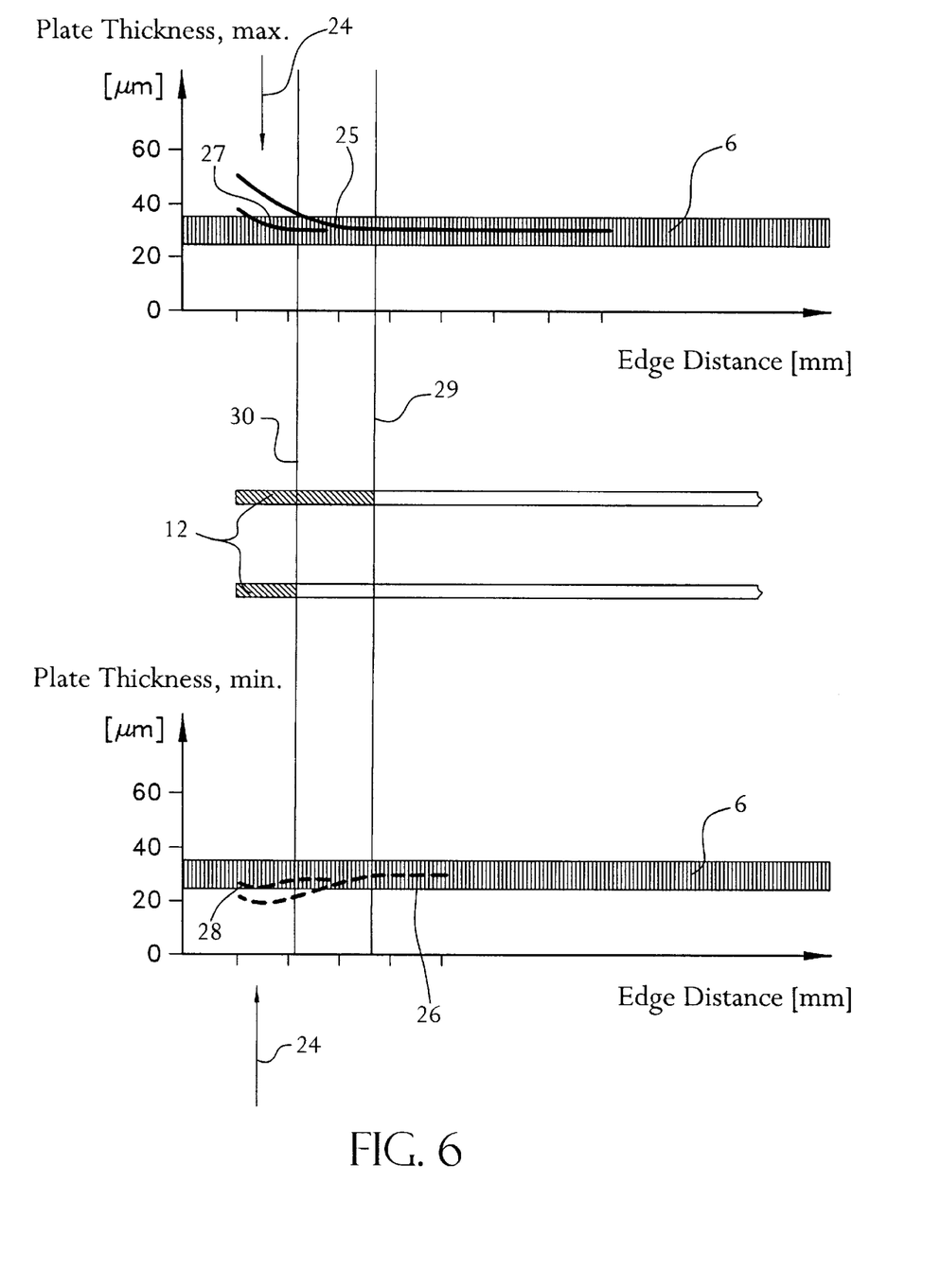
FIG. 6: Resulting plate thickness distributions on the printed-circuit board panel edge across the transporting direction according to the examples of FIGS. 4 and 5.

FIG. 6 shows the plate thickness flows 25, 26 and 27, 28 resp. across the transporting direction as they result from the processes according to FIGS. 4 and 5 resp. The representations can be compared with the representation in FIG. 2 as far as the scale is concerned. The position of the contact gripping points on the printed-circuit board 18 is marked with the arrow 24.

The plate thickness flows 25 and 26 in both figures apply for the maximum 8 and for the minimum 10 in two series-connected plant parts. The flows 27 and 28 accordingly apply to three plant parts. The corresponding limits 29 and 30 for the usable range of the printed-circuit board panel 12 where the achieved plate thicknesses still lie within the given tolerance range are shown in FIG. 6.

If appropriately used, the process according to the invention and the appliance can also be used for removing and/or thinning metals by electrolytic etching. The measures to be used for this purpose, deviate from the above mentioned metallising process and from the appliance by the fact that the polarity for the power supply to the contact elements and the panel, on the one hand, as well as to the counter-electrodes (cathodes instead of anodes), on the other hand, are reversed.

All the revealed features as well as combinations of the revealed features are subject of this invention unless they are expressly designated as already known.

REFERENCE LIST

1 Plate thickness flow in transporting direction with processes according to the state of the art
2 Location of a first contact gripping point (in first plant part)
3 Location of a second contact gripping point (in second plant part)
4 Position of the first contact gripping point
5 Position of the second contact gripping point
6 Tolerance zone
7 Plate thickness flow with maximum across the transporting direction with processes according to the state of the art
8 Plate thickness maximum between two contact gripping points
9 Plate thickness flow with minimum across the transporting direction with processes according to the state of the art
10 Plate thickness minimum
11 Border to unusable panel edge
12 Edge of printed-circuit board panel, printed-circuit film panel
13 Transporting direction
14 Contact gripping points of first plant part
15 First plant part
16 Contact gripping points of second plant part
17 Second plant part
18 Printed-circuit board, printed-circuit film panel
19 Drive in first plant part
20 Drive in second plant part
21 Plate thickness flow with two plant parts
22 Plate thickness flow with three plant parts
23 Contact gripping points of third plant part
24 Position of contact gripping points
25 Plate thickness flow with maximum for two plant parts
26 Plate thickness flow with minimum for two plant parts
27 Plate thickness flow with maximum for three plant parts
28 Plate thickness flow with minimum for three plant parts
29 Border for the usable area in case of two plant parts used
30 Border for the usable area in case of three plant parts used

What is claimed is:

1. Process for precise electrolytic precipitation or etching of metal layers up to the marginal area of printed-circuit board and printed-circuit film panels in a continuous-cycle plant where the panels in one or two opposite marginal areas are grasped by several contact elements driven in transporting direction characterised by the fact that the panels (18) are grasped in several subsequently arranged plant parts (15, 17) in transporting direction (13) at different contact gripping points (14, 16, 23) by the contact elements such that variations of metal plate thickness in the marginal area (12) of the panel are minimised.

2. Process according to claim 1, characterised by the fact that the contact elements are arranged such that there are equal distances T between them.

3. Process according to one of the claims 1 to 2, characterised by the fact that the distance V of the contact gripping points is kept constant from plant part (15) to plant part (17) by means of mechanical synchronisation of the drives (18, 20) of the contact elements in the plant parts.

4. Process according to claim 3, characterised by the fact that the distance V of the contact gripping points (14, 16, 23) is adjusted towards each other from plant part (15) to plant part (17) by means of mechanical adjustment of the phase relation of the contact elements of different plant parts.

5. Process according to one of the above mentioned claims 1–2 characterised by the fact that the contact elements are driven such that the contact gripping points (14, 16, 23) are offset by a constant distance V on the panel (18) from plant part (15) to plant part (17).

6. Process according to claim 5, characterised by the fact that the contact gripping points are spaced apart a distance V and the distance V of the contact gripping points (14, 16, 23) is adjusted to a value resulting from the quotient of distance T of the contact elements and the number of subsequently arranged plant parts (15, 17).

7. Process according to claim 5 characterised by the fact that the distance V of the contact gripping points (14, 16, 23) is kept constant from plant part (15) to plant part (17) by electrical synchronisation of the drives (19, 20) of the contact elements in the plant parts.

8. Process according to claim 5 characterised by the fact that the distance V of the contact gripping points is adjusted towards each other from plant part (15) to plant part (17) by electrical adjustment of the phase relation of the contact elements of different plant parts.

9. Process according to claim 5, characterised by the fact that the distance V of the contact gripping points is kept constant from plant part (15) to plant part (17) by means of mechanical synchronisation of the drives (18, 20) of the contact elements in the plant parts.

10. Appliance for precise electrolytic precipitation or etching of metal layers up to the marginal area of printed-circuit board and printed-circuit film panels in a continuous-cycle plant having transport means and driven contact elements for the panels with such an arrangement of contact element that they can grasp the panels in one or two opposite marginal areas, characterised by the fact that the continuous-cycle plant consists of several plant parts (15, 17) subsequently arranged in transporting direction (13) and that the contact elements are arranged such that the panels (18) can be grasped in different plant parts at different contact gripping points (14, 16, 23) in order to minimise variations of metal plate thickness in the marginal area (12) of the panels.

11. Appliance according to claim 10, characterised by the fact that the contact elements in all plant parts (15, 17) are arranged such that there are equal distances T between them.

12. Appliance according to one of the claims 10 to 11, characterised by the fact that the drives (19, 20) of the contact elements in the plant parts (15, 17) are designed such that they can be synchronised electrically or mechanically such that the distance V of the contact gripping points (14, 16, 23) can be kept constant from plant part to plant part.

13. Appliance according to one of the claims 10 and 11, characterised by the fact that there is a particularly designed control for the drives (19, 20) of the contact elements in the plant parts (15, 17) such that the contact gripping points (14, 16, 23) on the panel (18) can be offset from plant part to plant part by a presettable constant distance V.

14. Appliance according to claim 13, characterised by the fact that the drives (19, 20) of the contact elements in the plant parts (15, 17) are designed such that they can be synchchronized electrically or mechanically such that the distance V of the contact gripping points (14, 16, 23) can be kept constant from plant part to plant part.

* * * * *